(12) United States Patent
Teramoto et al.

(10) Patent No.: US 7,734,083 B2
(45) Date of Patent: Jun. 8, 2010

(54) PRINTED BOARD, IMAGE PICKUP APPARATUS AND CAMERA

(75) Inventors: Tougo Teramoto, Wakayama (JP); Masahiro Takashima, Hachioji (JP)

(73) Assignee: Konica Minolta Opto, Inc., Tokyo (JP)

( * ) Notice: Subject to any disclaimer, the term of this patent is extended or adjusted under 35 U.S.C. 154(b) by 1014 days.

(21) Appl. No.: 11/478,779

(22) Filed: Jun. 29, 2006

(65) Prior Publication Data
US 2007/0019076 A1    Jan. 25, 2007

(30) Foreign Application Priority Data
Jul. 8, 2005    (JP) .............................. 2005-199866

(51) Int. Cl.
*G06K 9/00*    (2006.01)
(52) U.S. Cl. ....................... 382/147; 382/152; 396/542; 439/329
(58) Field of Classification Search ............. 360/97.01, 360/98.01; 382/145, 147, 152; 396/281, 396/287, 296, 542; 439/165, 329, 493
See application file for complete search history.

(56) References Cited

U.S. PATENT DOCUMENTS

| | | | | |
|---|---|---|---|---|
| 5,245,486 A | * | 9/1993 | Hachiya et al. | 360/97.01 |
| 5,740,482 A | * | 4/1998 | Inazuka | 396/296 |
| 5,995,373 A | * | 11/1999 | Nagai | 361/755 |
| 6,960,094 B2 | * | 11/2005 | Tomonari et al. | 439/329 |
| 7,298,583 B2 | * | 11/2007 | Miyazaki et al. | 360/97.01 |
| 7,471,893 B2 | * | 12/2008 | Lu et al. | 396/542 |
| 7,586,519 B2 | * | 9/2009 | Nomura et al. | 348/208.4 |
| 2004/0201707 A1 | * | 10/2004 | Noguchi et al. | 348/208.7 |
| 2005/0243459 A1 | * | 11/2005 | Kimura et al. | 360/97.01 |
| 2005/0265716 A1 | * | 12/2005 | Tsuji | 396/542 |

FOREIGN PATENT DOCUMENTS

JP    10335759 A    * 12/1998

OTHER PUBLICATIONS

Japanese translation, Sasaki, Akihiro, Dec. 1998, JP 1033579 A, 3 pages.*

* cited by examiner

*Primary Examiner*—Gregory M Desire
(74) *Attorney, Agent, or Firm*—Cohen Pontani Lieberman & Pavane LLP

(57) ABSTRACT

The present invention relates to a bendable printed board, an image pickup apparatus, and a camera. The bendable printed board is provided with: a first end connected to a moving body movable in an arbitral direction within a predefined plane; a second end connected to fixed body with slack providing movability to the moving body; and a slit formed on at least a part of a slack portion of the printed board.

10 Claims, 15 Drawing Sheets

PRINTED BOARD, IMAGE PICKUP APPARATUS AND CAMERA

This application is based on Japanese Patent Application No. 2005-199866 on Jul. 8, 2005, in Japanese Patent Office, the entire content of which is hereby incorporated by reference.

TECHNICAL FIELD

The present invention relates to a bendable printed board that is suitable when connecting to a moving body organized to be capable of moving in a prescribed plane and relates to an image pickup apparatus providing camera shake correction by using the moving body including an image pickup element and further relates to an camera including the image pickup apparatus.

BACKGROUND

Active camera shake correction technologies have so far been put into practical use to obtain a clear image by correcting misalignment of an optical axis caused by camera shake. There is known three types of camera shake correction technologies including the first type that a part of an image pickup optical system is moved, the second type that the whole of the image pickup optical system is moved and the third type that an image pickup element is moved.

Among these active camera shake correction technologies, the third type of technology providing the camera shake correction that an image pickup element moves in a plane perpendicular substantially to an optical axis of the image pickup optical system, has an advantage that the technology can cope with all imaging optical systems to be used.

With respect to the third type of technology that the image pickup element moves, TOKUKAI No. 2003-110929 discloses an image pickup apparatus provided with: a printed board in which an image pickup element and another electric component arranged and which moves with the image pickup element; and a flexible printed board having one end connected to the printed board.

The image pickup apparatus disclosed in the aforesaid patent document is provided to improve space efficiency of the total device. However, the flexible printed board for connecting between the image pickup element that moves and another printed board that does not move are incorporated to the image pickup apparatus with sufficient slack as illustrated, and the image pickup apparatus needs an enough space for this slack.

The greater an amount of this slack of the flexible printed board is, the more the load resistance caused by the printed board when an image pickup element and its peripheral member both representing a moving body can be reduced, resulting in a contribution to downsizing of an actuator and to electric power saving. However, a space to slacken the printed board needs to be secured, resulting in an obstacle for further downsizing.

SUMMARY

In view of the problems stated above, an object of the present invention is to obtain a flexible printed board reducing the load resistance of a moving body such as, for example, an image pickup element and its peripheral member even when an amount of slack is small, and to obtain an image pickup apparatus with a camera shake correction mechanism of a type that an image pickup element moves, being downsized and saving electric power realizing.

The above problems are solved by the following embodiment that: a printed board having a first end connected to a moving body movable in an arbitral direction within a predefined plane; a second end connected to a fixed body with slack providing movability to the moving body; and a slit formed in a predefined area on the printed board.

BRIEF DESCRIPTION OF THE DRAWINGS

Embodiments will now be described, by way of example only, with reference to the accompanying drawings which are meant to be exemplary, not limiting, and wherein like elements numbered alike in several Figures, in which.

Figure 4:
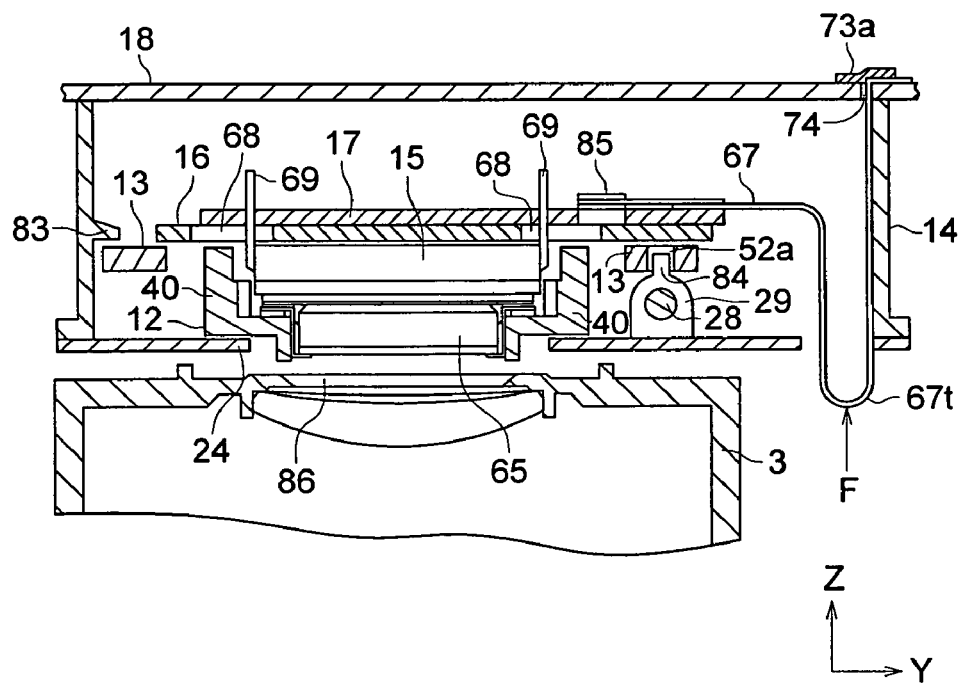
FIG. 4 is a sectional view taken on line D-D of the image pickup apparatus shown in FIG. 2.
Figure 7:
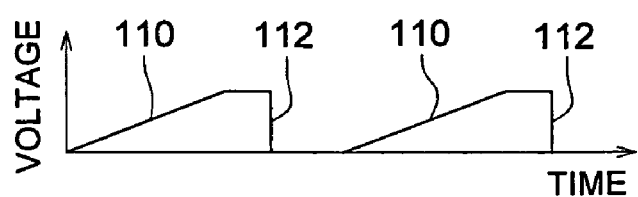
Figure 7:
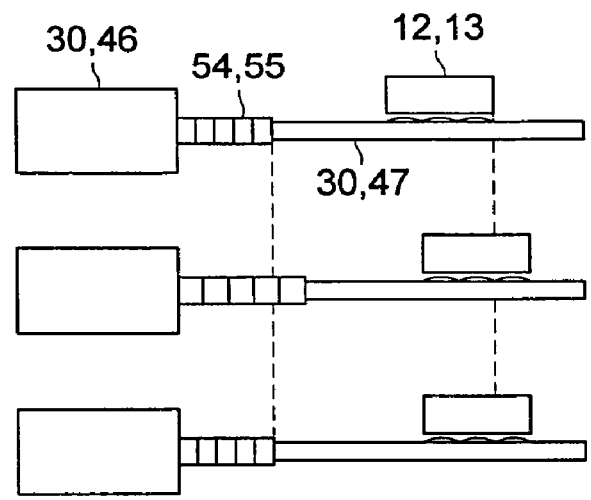
Figure 7:
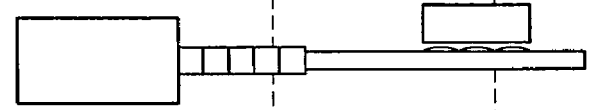
Figure 7:
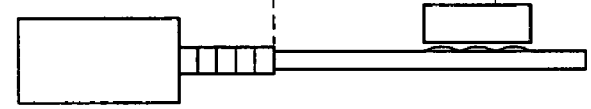
Figure 8A:
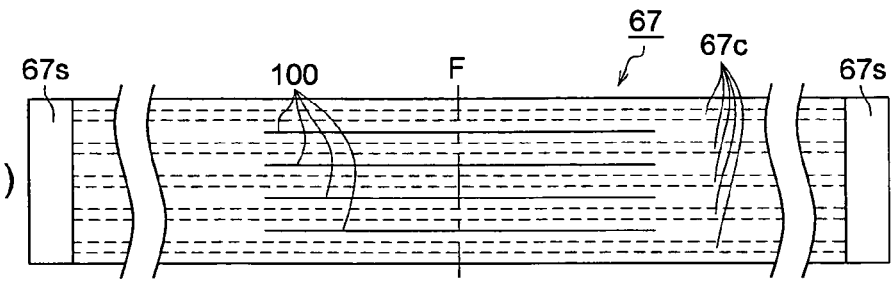
Figure 8B:
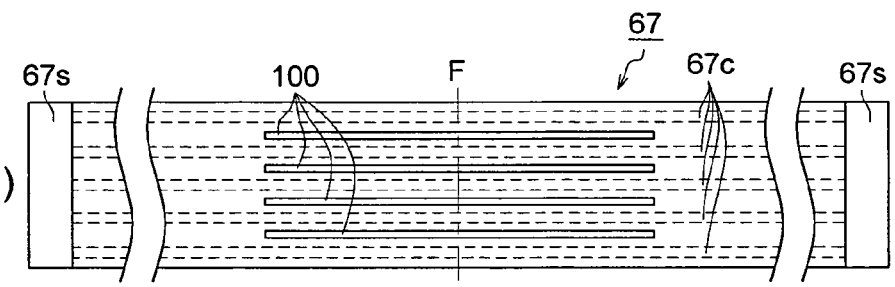
Figure 8C:
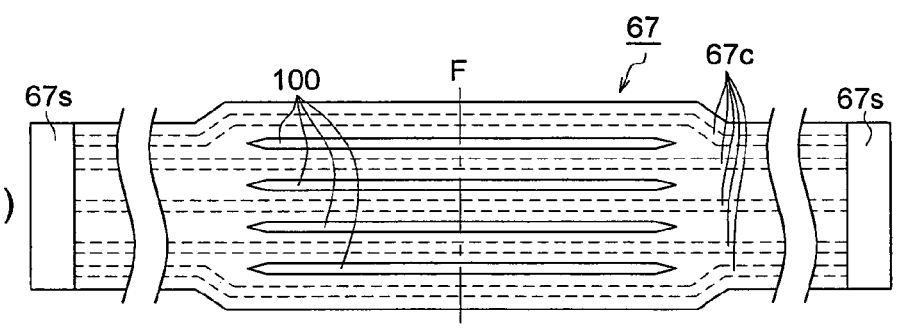
Figure 9:
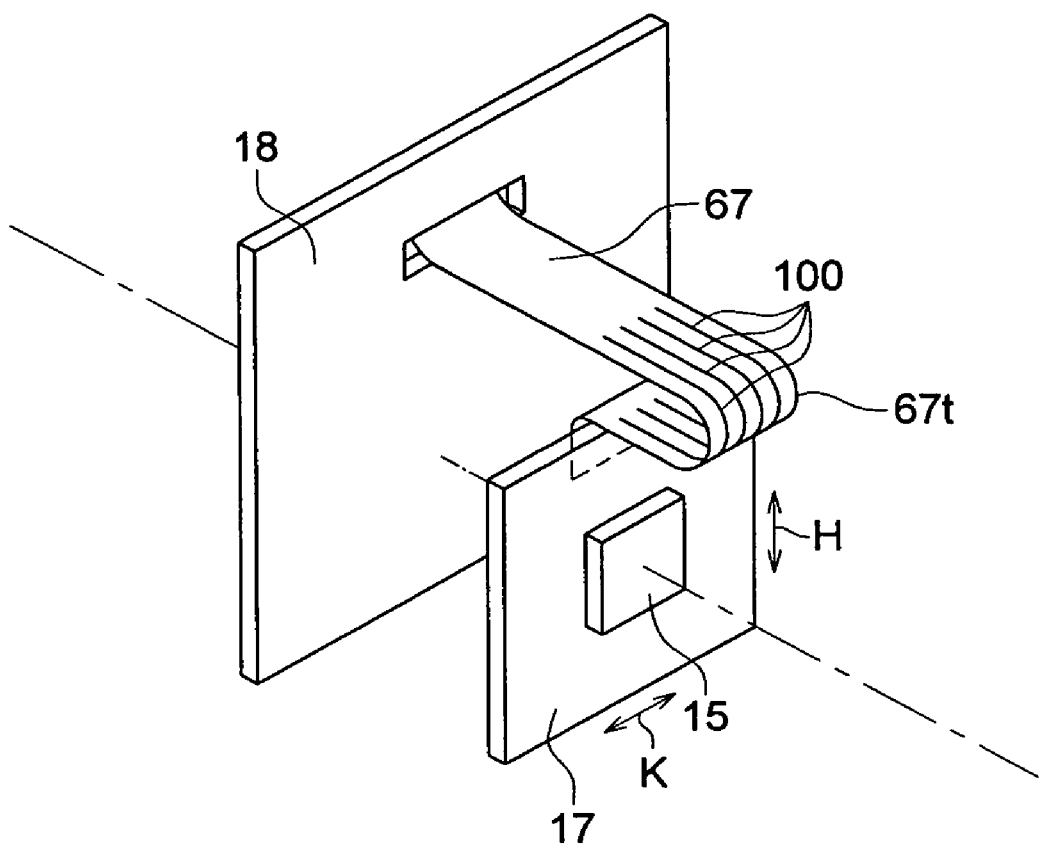
Figure 10A:
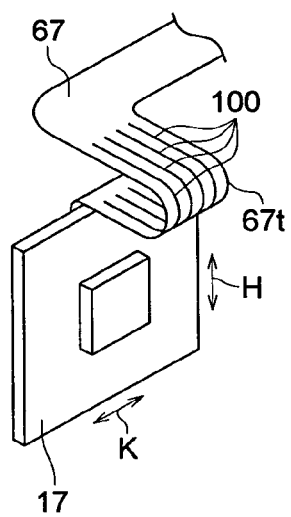
Figure 10B:
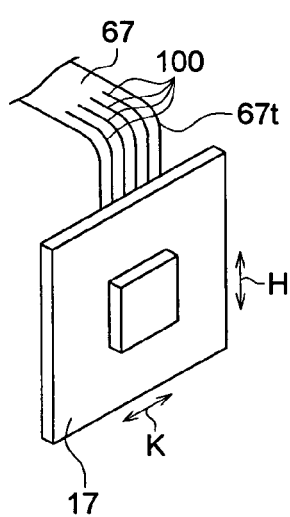
Figure 10C:
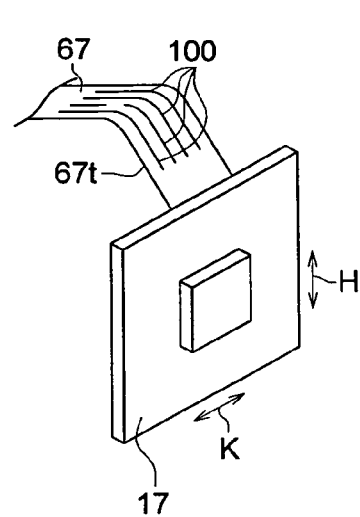
Figure 11:
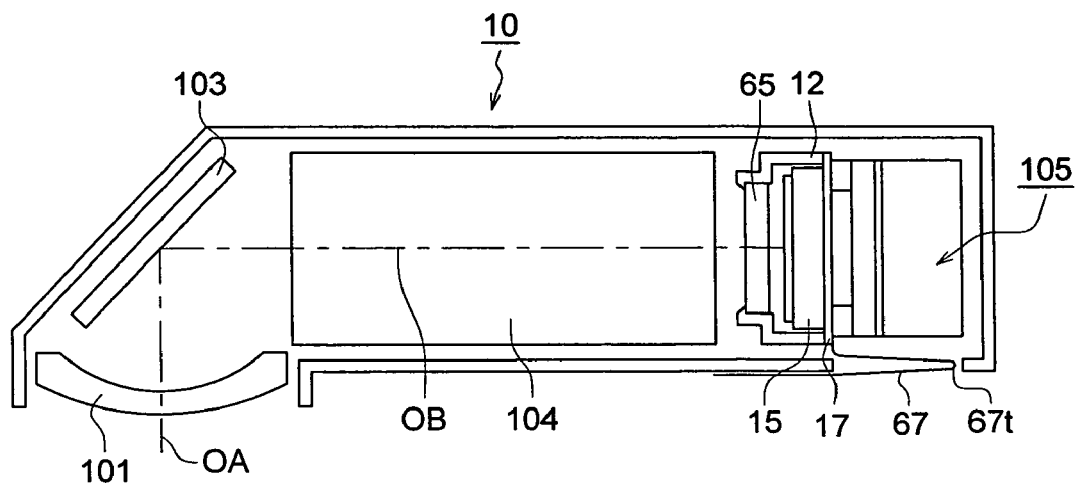
Figure 11:
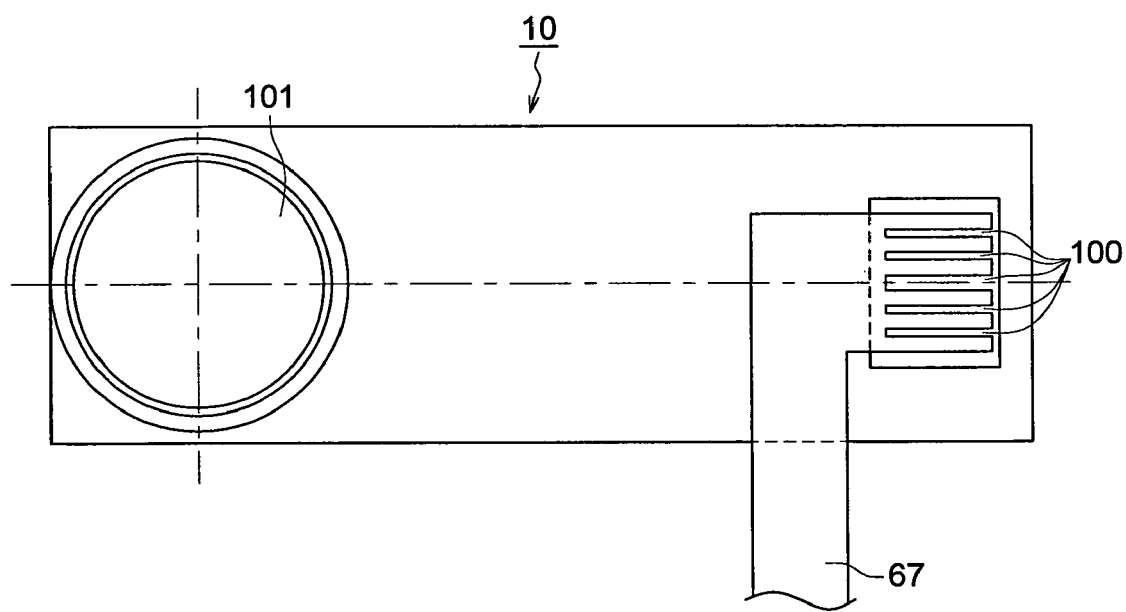
Figure 12A:
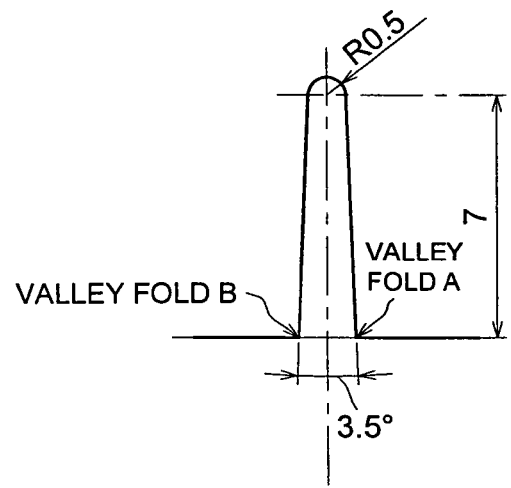
Figure 12B:
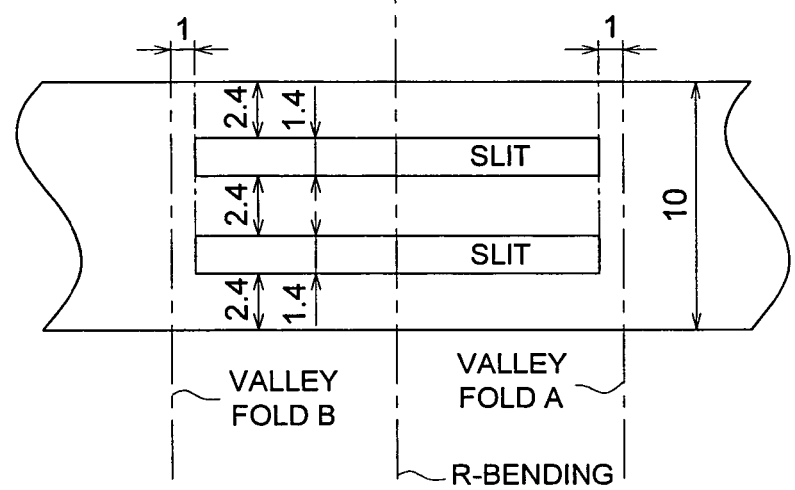
Figure 12C:
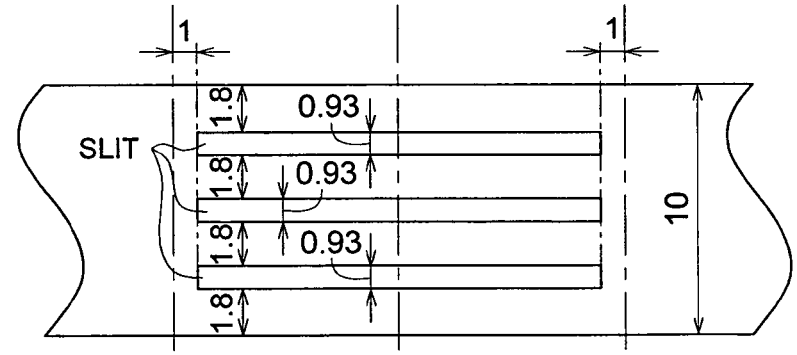
Figure 13:
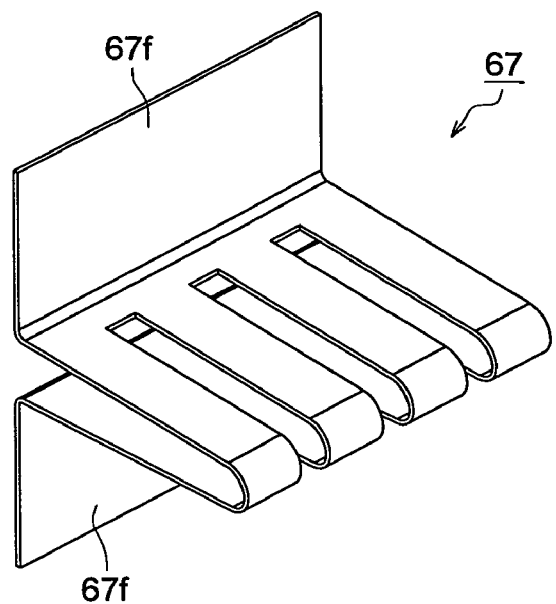
Figure 14:
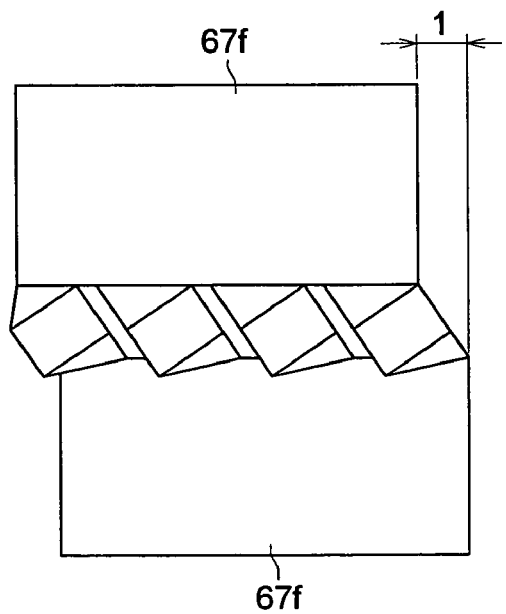
Figure 15:
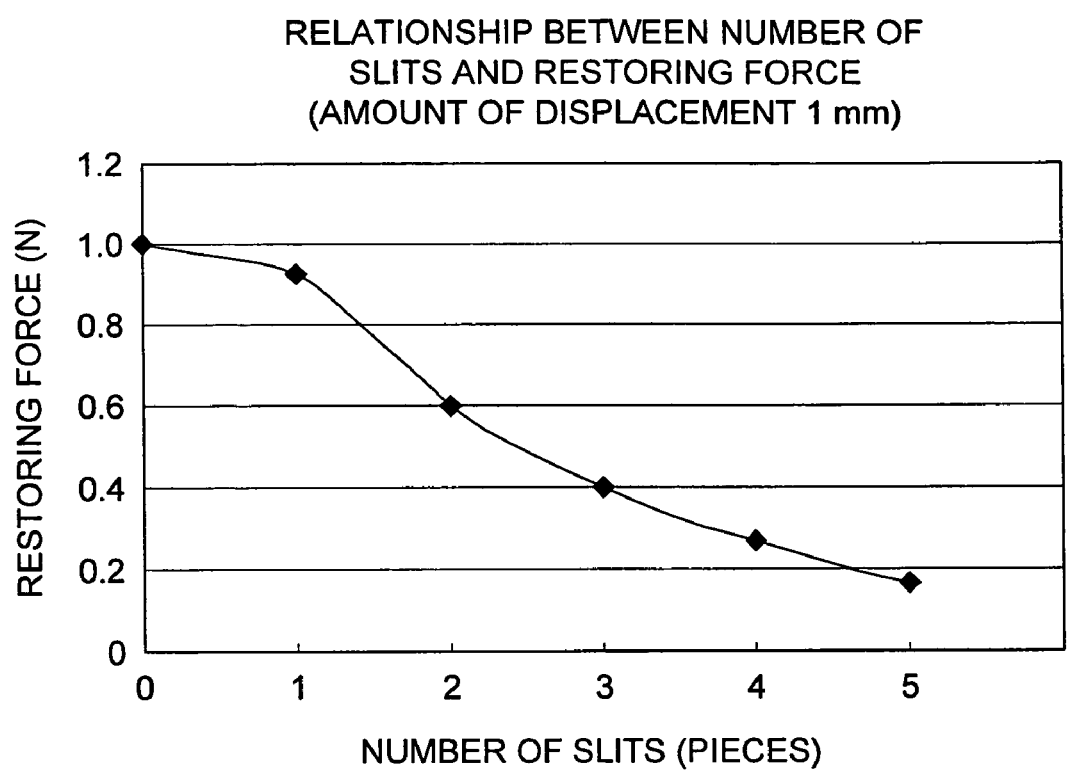
Figure 16:
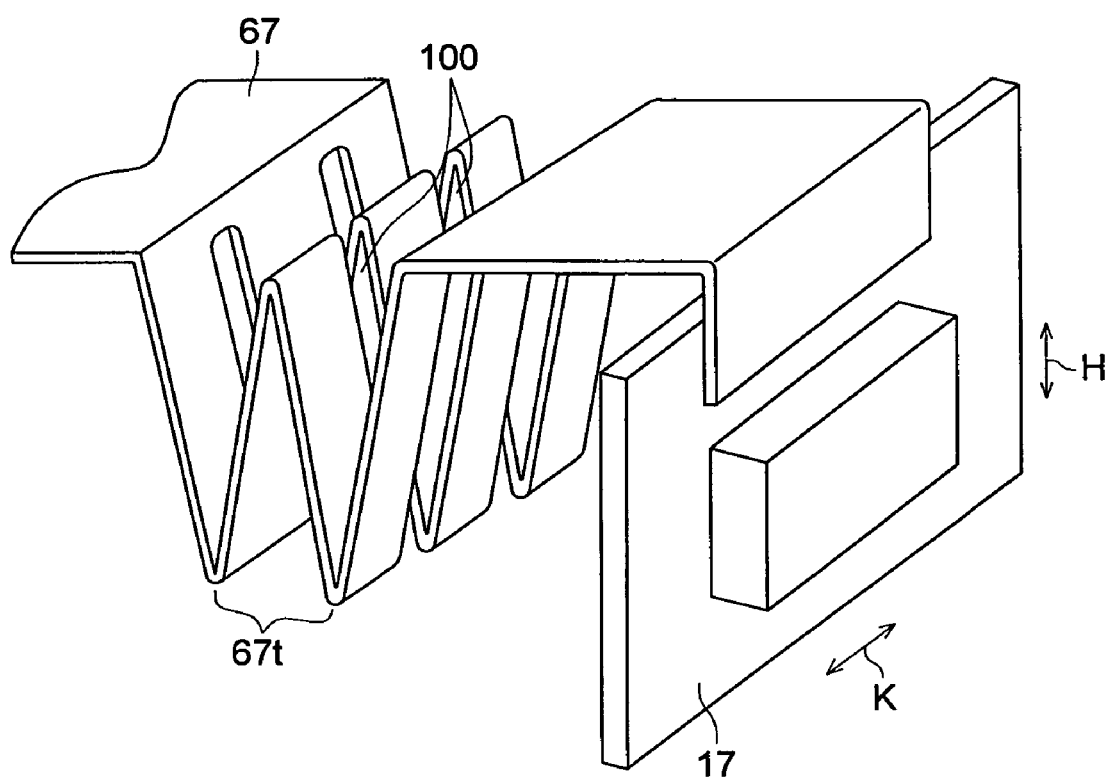
Figure 17A:
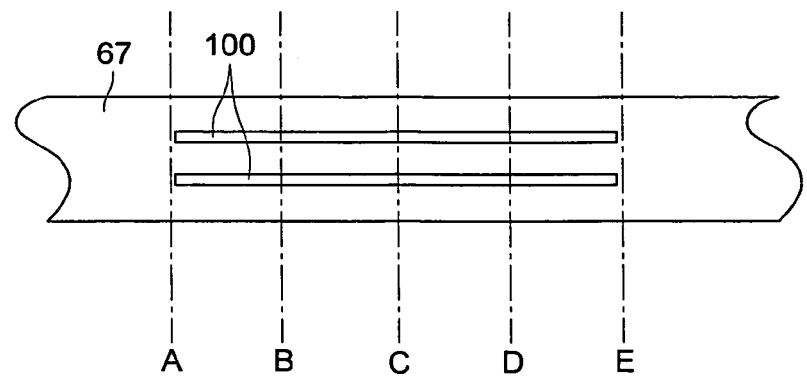
Figure 17B:
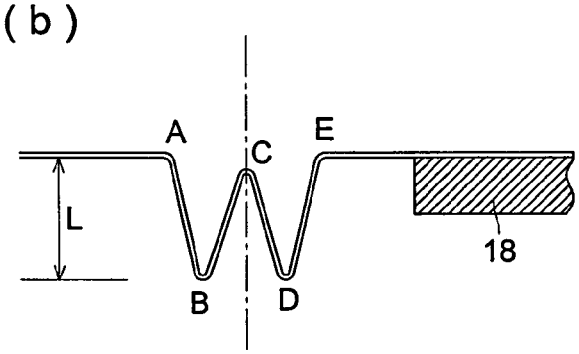
Figure 17C:
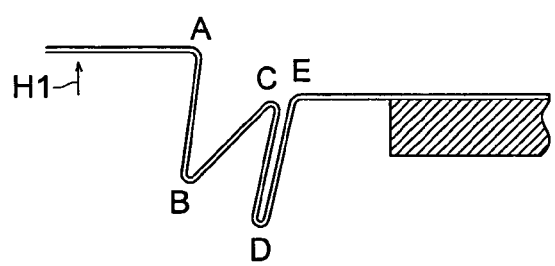
Figure 17D:
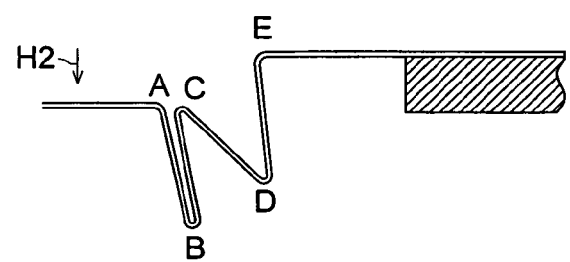
Figure 18A:
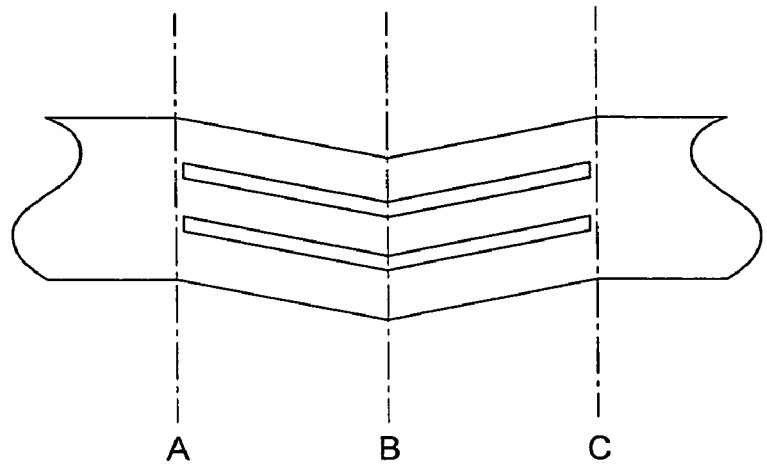
Figure 18B:
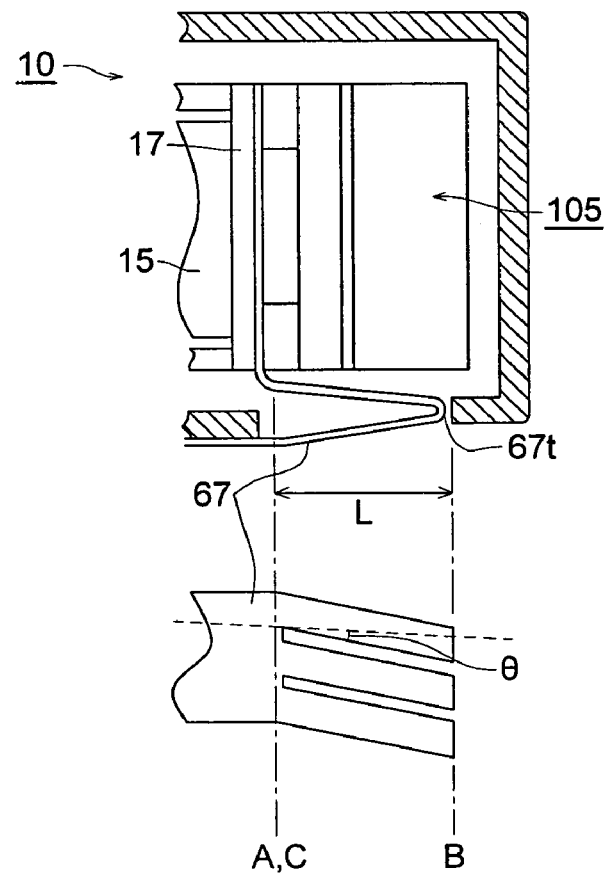

Each of FIGS. 7(a), 7(b1), 7(b2) and 7(b3) is a diagram showing a driving principle of an actuator;

Each of FIGS. 8(a) to 8(c) is a development elevation showing an example of a shape of a flexible printed board shown in FIG. 4;

FIG. 9 is a perspective view showing the first board, the second board and a flexible printed board drawn out;

Each of FIGS. 10(a) to 10(c) is a diagram showing another example of the flexible printed board;

Each of FIGS. 11(a) and 11(b) is a diagram showing another example of an image pickup optical system to which a bendable printed board according to the present embodiment is applied;

Each of FIGS. 12(a) to 12(c) is a diagram showing a shape of the flexible printed board which served as a test sample;

FIG. 13 is a perspective view of the flexible printed board folded to be a side view shown in FIG. 12(a);

FIG. 14 is a diagram showing measurement conditions;

FIG. 15 is a graph showing measurement results of restoring force;

FIG. 16 is a diagram showing another example of a flexible printed board according to the present invention;

Each of FIGS. 17(a) to 17(d) is a diagram showing another example of a flexible printed board according to the present invention; and Each of FIGS. 18(a) and 18(b) is a diagram showing another example of a flexible printed board according to the present invention.

DESCRIPTION OF THE PREFERRED EMBODIMENT

Preferred embodiments according to the present invention are described below.

(Item 1) A bendable printed board including: a first end connected to a moving body movable in an arbitral direction within a predefined plane; a second end connected to a fixed body with slack providing movability to the moving body; and a slit formed on at least a part of a slack portion of the printed board and extending along the slack.

(Item 2) The printed board described in Item 1 in which the slit is an open-slit.

(Item 3) The printed board described in Item 1 or 2 in which the printed board is arranged to turn back on the slack portion.

(Item 4) The printed board of any one of Items 1 to 3 in which the slack portion has a thickness in a range of 0.02 mm to 0.2 mm.

(Item 5) A bendable printed board including: a first end connected to a moving body movable in an arbitral direction within a predefined plane; a second end connected to a fixed body with slack providing movability to the moving body; a plurality of wirings connected between the first end and the second end; and at least one slit arranged at least a part of a slack portion between the plurality of wirings.

(Item 6) The printed board described in Item 5 in which the slit is an open-slit.

(Item 7) The printed board described in Item 5 or 6 in which the printed board is arranged to turn back on the slack portion.

(Item 8) The printed board described in any one of Item 5 to 7 in which the slack portion has a thickness in a range of 0.02 mm to 0.2 mm.

(Item 9) An image pickup apparatus including: an image pickup optical system for guiding a subject light flux; a movable section including an image pickup element for photoelectrically converting the light flux guided by the image pickup optical system; and a bendable printed board. The bendable printed board includes a first end connected to the movable section for inputting signal from or outputting signal to the image pickup element; a second end connected to a fixed body with slack; and a slit formed on at least a part of a slack portion of the printed board and extending along the slack. The movable section is movable in an arbitral direction within a plane perpendicular to an optical axis of the image pickup optical system.

(Item 10) The image pickup apparatus described in Item 9 in which the slit is an open-slit.

(Item 11) The image pickup apparatus described in Item 9 or 10 in which the slack portion is bent at an angle of 90 degrees or more.

(Item 12) The image pickup apparatus described in any one of Items 9 to 11 in which the printed board is arranged to turn back on the slack portion.

(Item 13) An image pickup apparatus including: an image pickup optical system for guiding a subject light flux; a movable section including an image pickup element for photoelectrically converting the light flux guided by the image pickup optical system; and a bendable printed board. The bendable printed board includes a first end connected to the movable section for inputting signal from or outputting signal to the image pickup element; a second end connected to a fixed body with slack; and a plurality of wirings connected between the first end and the second end; and at least one slit arranged at least a part of a slack portion between the plurality of wirings. The movable section is movable in an arbitral direction within a plane perpendicular to an optical axis of the image pickup optical system.

(Item 14) The image pickup apparatus described in Item 13 in which the slit is an open-slit.

(Item 15) The image pickup apparatus described in Item 13 or 14 in which the slack portion is bent at an angle of 90 degrees or more.

(Item 16) The image pickup apparatus described in any one of Item 13 to 15 in which the printed board is arranged to turn back on the slack portion.

(Item 17) A camera comprising the image pickup apparatus described in any one of Items 9 to 16.

The present invention provides a flexible printed board for connecting to a moving body movably in an arbitral direction in the prescribed plane with reduced load resistance for the movement even when a slacked amount of the flexible printed board is small. When an embodiment according to the invention is applied to camera shake correction mechanism of a type to move an image pickup element of an image pickup apparatus, it is possible to obtain an image pickup apparatus realizing further downsizing and electric power saving.

While the preferred embodiments of the present invention have been described using specific terms, such description is for illustrative purposes only, and it is to be understood that changes and variations may be made without departing from the sprit or scope of the appended claims.

There will be explained in detail as follows an embodiment according to the invention, however, it does not limit the scope of the invention.

In the meantime, the printed board according to the present invention is provided to be used by connecting to a moving body movable in an arbitral direction in a prescribed plane independently of a use, and an explanation will be given with an example that the printed board according to the invention is applied to an image pickup apparatus having a camera shake correction mechanism of a type that an image pickup element moves as a moving body.

Figure 1:
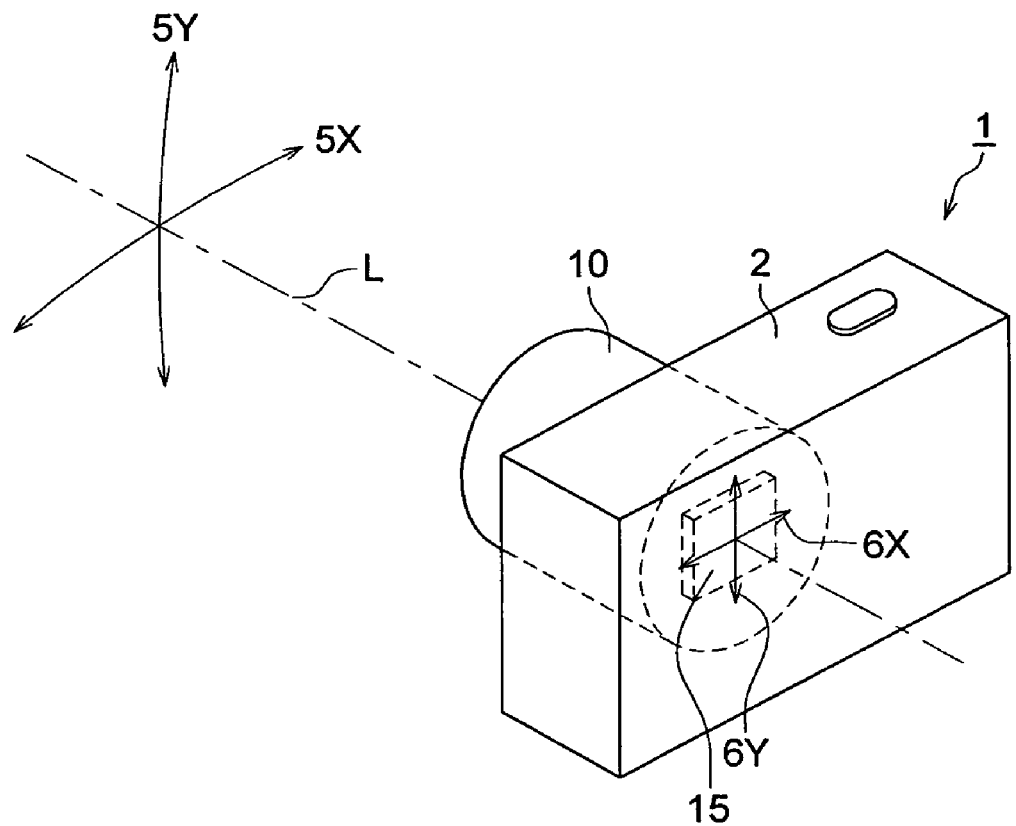
FIG. 1 is a schematic structural diagram of a camera employing an image pickup apparatus according to the present embodiment.

FIG. 1 is a schematic structural diagram of a camera employing an image pickup apparatus according to the present embodiment.

As shown in FIG. 1, the image pickup apparatus according to the present embodiment is mounted on camera 1 provided with main body 2 and image pickup apparatus 10, to be used. The image pickup apparatus 10 is provided with an optical unit including plural lenses and a lens barrel, and an image pickup unit including therein a camera shake correction function provided with an image pickup element that is connected to the optical unit to be used. The optical unit is provided to move plural lenses and to perform at least one of zooming operation and focusing operation. The image pickup unit is arranged so that image pickup element 15 is moved as shown with arrows 6X and 6Y in FIG. 1 to correct deviation of an optical axis, when camera 1 is shaken in the course of photographing and an optical axis of the optical unit is deviated from the position shown with L in FIG. 1 as shown with arrows 5X and 5Y in FIG. 1.

The image pickup unit having therein the aforesaid camera shake correction function will be explained as follows.

Figure 2:
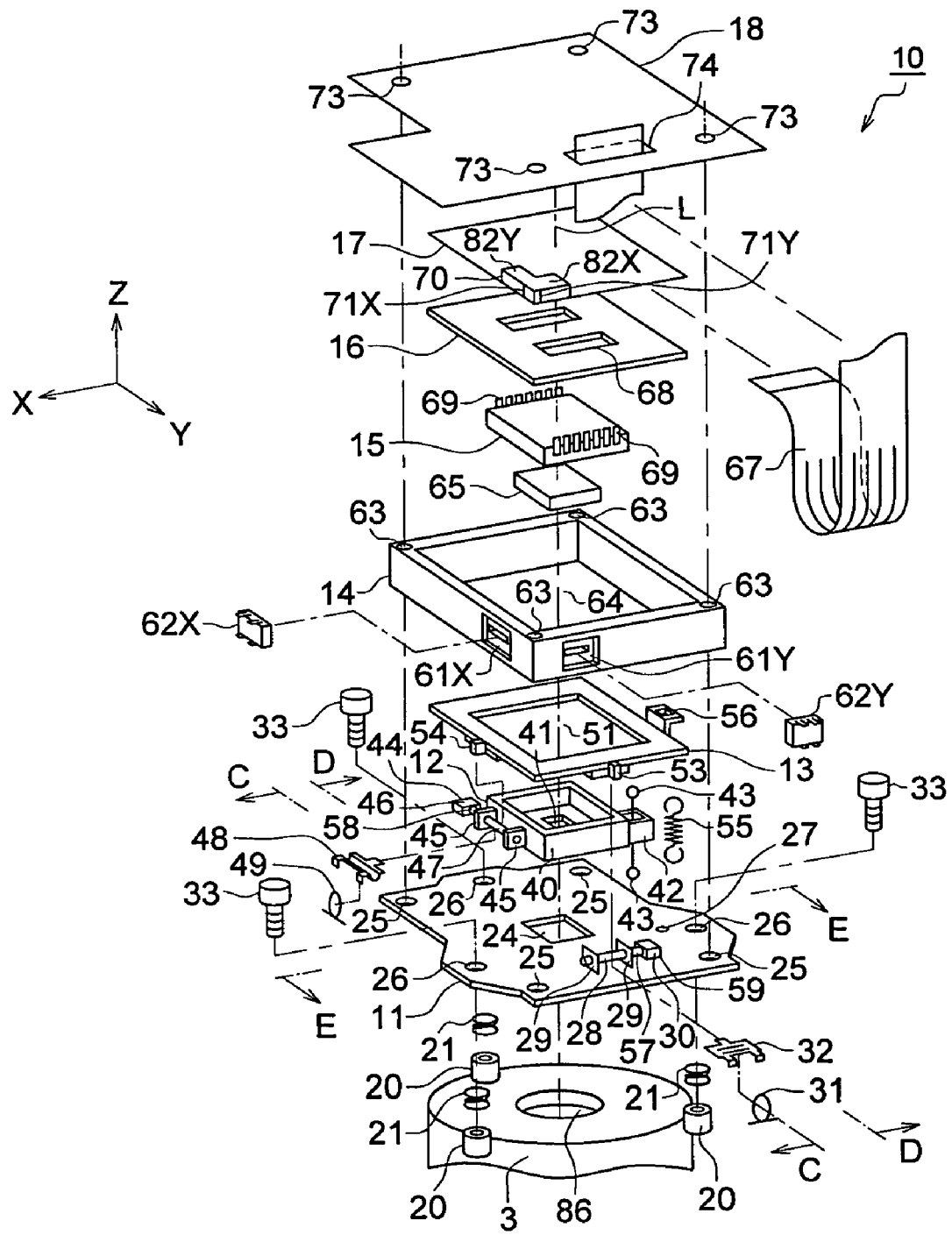
FIG. 2 is an exploded perspective view for composition of an image pickup apparatus according to the present embodiment.
Figure 3:
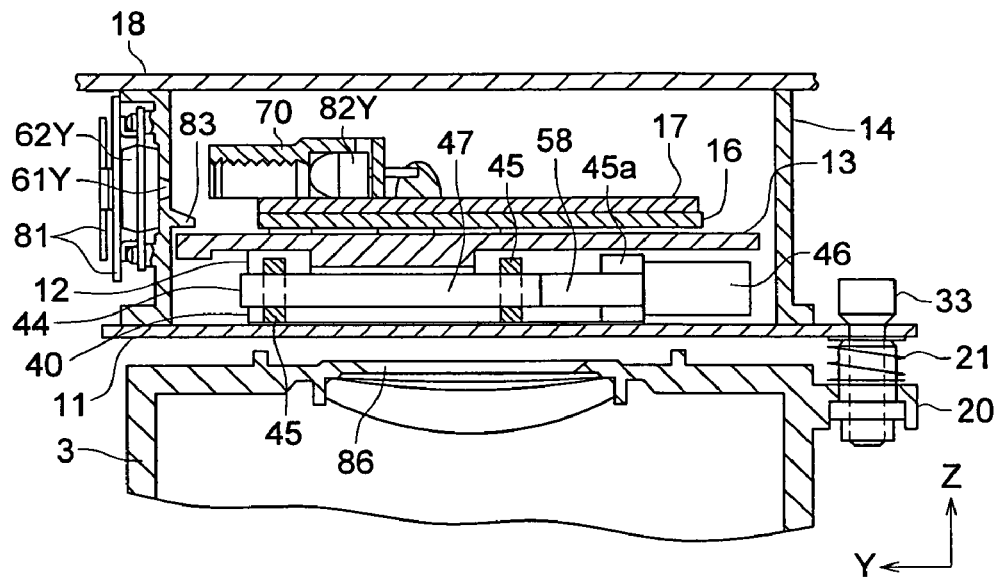
FIG. 3 is a sectional view taken on line C-C of the image pickup apparatus shown in FIG. 2.
Figure 5:
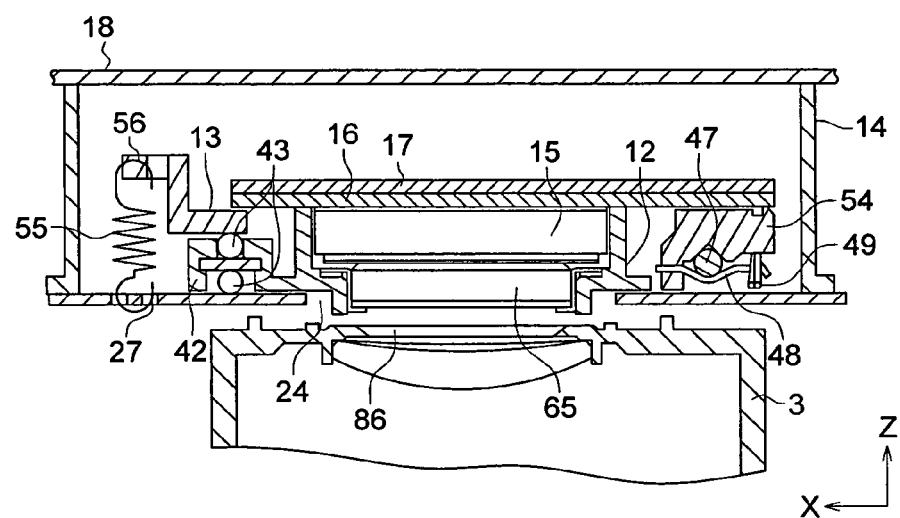
FIG. 5 is a sectional view taken on line E-E of the image pickup apparatus shown in FIG. 2.

FIG. 2 is an exploded perspective view for composition of an image pickup apparatus according to the present embodiment. FIG. 3 is a sectional view taken on line C-C of the image pickup apparatus shown in FIG. 2. FIG. 4 is a sectional view taken on line D-D of the image pickup apparatus shown in FIG. 2. FIG. 5 is a sectional view taken on line E-E of the image pickup apparatus shown in FIG. 2. Incidentally, in the following drawings, an explanation will be given by giving the same symbols to members with the same functions, for avoiding overlapping of explanation.

The image pickup unit is provided with base member 11 that serves as a basis, first stage 13 that moves in the horizontal direction (hereinafter referred to as X-axis direction) for the base member 11, second stage 12 that moves in the vertical direction (hereinafter referred to as Y-axis direction for illustration) that is perpendicular to the movement direction (X-axis direction) of the first stage 13, image pickup element 15 that is fixed on the second stage 12 and with PSD holder 14 having thereon PSD representing a position detecting element that detects an amount of movement of the first and second stages fixed on the base member (hereinafter referred to as PSD).

Further, the base member 11 that shakably supports the image pickup element 15, the first stage 13, the second stage 12 and PSD holder 14 are positioned around the image pickup element 15 (including printed board processing information coming from the image pickup element) and are arranged to fill the excessive space of the outline of a bottom surface of lens barrel 3 and the outline of the image pickup element 15.

The base member 11 is a metal frame that is provided to be in a plate almost perpendicular to the direction of optical axis L (hereinafter referred to as Z-axis direction), and has, at its central portion, large hole 24 for an optical axis. On the base member 11, there are provided PSD holder fixing hole 25 for fixing the PSD holder 14, lens tube fixing hole 26 for fixing the base member 11 to lens tube 3 and pressure spring hook 27 for fixing a pressure spring hooked between the base member 11 and the first stage 13.

As shown in FIG. 2 and FIG. 3, the base member 11 is fixed by adjusting screw 33 and adjusting spring 21 between three fixing sections 20 provided at three locations around the lens barrel 3 in order to connect the image pickup unit to the optical unit so that a position for lens barrel 3 may be adjusted (by tilting or by shifting in the lens back side). A distance between the base member 11 and a bottom surface of the lens barrel 3 and its inclination can be adjusted by adjusting spring 21 used for the fixing section 20, and thereby, an optical axis between the optical unit and the imaging unit can be adjusted.

On the base member 11, there are provided rod-supporting arm 29 and a positioning arm (not shown) in the Z-axis direction. On the rod-supporting arm 29, there is provided a first actuator having the structure wherein piezoelectric element 57 is fixed on the end of vibration transmission rod 28 and weight 30 is fixed on the other end of the piezoelectric element 57. The first actuator is fixed on the base member 11, in the direction in which the vibration transmission rod 28 is extended in the X-axis direction under the state where the weight 30 is in contact with the positioning arm, with both end portions of the vibration transmission rod 28 engaged with the rod-supporting arm. For adhesion between the rod-supporting arm 29 and the vibration transmission rod 28, it is preferable to use adhesive agents such as silicone adhesive agents in which elasticity remains even after hardening. For adhesion between the positioning arm 29 and weight 30, soft rubber type adhesives or silicone-containing adhesives are preferably used.

As shown in FIG. 4, on a top surface of each of two rod-supporting arm 29 on the base member 11, there is provided protrusion 84 that extends in the Z-axis direction. The protrusion 84 is engaged with movement restricting hole 52a of the first stage 13 in the course of assembling.

The first stage 13 is arranged to be closer to an image plane than the base member 11 is, in the optical axis direction (Z-axis direction). The first stage 13 is provided with an aluminum rectangular frame having thereon opening 51 for accepting second stage 12, in the almost same plane. On the first stage 13, there are provided first rod touching section 53 that comes in contact with vibration transmission rod 28 for the first actuator 59 fixed on the base member 11, second rod touching section 54 that comes in contact with vibration transmission rod 47 for the second actuator 44 fixed on the second stage described later, pressure spring hook 56 on which pressure spring 55 is hooked between the pressure spring hook 27 of the base member 11 and movement restricting hole 52a.

In the first rod touching section, vibration transmission rod 28 of the first actuator 59 is interposed vertically by cap 32 representing a separate member and spring 31, and is connected to the first actuator slidably along the vibration transmission rod 28. One end of the cap 32 is hooked on the first stage, then the central portion of the cap 32 comes in contact with the vibration transmission rod 28, and the other end thereof is pulled by interposing spring 31, to be fixed on the first rod touching section of the first stage. A contact pressure between the cap 32 and the vibration transmission rod 28 is about double the force of interposing spring 31. The interposing spring 31 is a torsion coil spring. Both arms and a central circular arc portion of the interposing spring 31 are hooked on two hooks of the cap 32 and on a spring hook of the first stage 13.

Movement restricting hole 52a engages loosely with protrusion 84 on the tip of rod-supporting arm 29 of base member 11 (see FIG. 4). The movement restricting hole 52a is an elongated hole extended in the direction of movement (X-axis direction) for determining an amount of movement of the first stage 13, and it engages with the protrusion in the direction of shorter side (Y-axis direction) so that the first stage may move only in the X-axis direction, and its both ends restrict the movement. Further, it prevents that the vibration transmission rod 28 and the first stage 13 move (drop off) in the direction of shorter side of the movement restricting hole (Y-axis direction).

As shown in FIG. 5, owing to the pressure spring 55 hooked on pressure spring hooks 27 and 56 provided respectively on the base member 11 and the first stage 13 in the course of assembling, the first stage 13 is urged in the direction to approach the base member 12, and it prevents that the first stage 13 rotates on the center of the vibration transmission rod 28 of the first stage 13.

Second stage 12 is casing 40 that is made of conductive resin and is equipped with opening 41 on its bottom, and it holds image pickup element 15, radiator plate 16, low pass filter 65 and second actuator 44. The radiator plate 16 comes in contact with a back side of the image pickup element 15 to be fixed on the second stage 12 to cover the opening formed by surrounding wall 40 of the second stage 12. The low pass filter 65 that is positioned to be close contact with image pickup element 15 through a space frame positioned in front of the image pickup element is pressed against the radiator plate 16 from the front side.

The second stage 12 holds second actuator 44. The second actuator 44 is stuck to supporting arm 45 provided on the side of the casing 40 to be held. Weight 46 is stuck to the second stage 12 under the condition that the tip and the very end (on the piezoelectric element 55 side) of vibration transmission rod 47 are subjected to axial fitting with two rod-supporting arms of the second stage 12, and weight 46 is in contact with positioning surface 45a (see FIG. 3) provided equally in the second stage. For adhesion for vibration transmission rod 60, adhesive agents in which elasticity remains even after hardening, such as silicone adhesives are preferably used, while, for contact for weight 58, soft rubber type adhesives or silicone-containing adhesives are preferably used, in the same way as in adhesion for the aforesaid first actuator 59.

The second actuator 44 of the second stage 12 is interposed between the second rod touching section 54 and cap 48. As a result, friction combination is carried out under the state that the second stage 12 is arranged in opening 51 of the first stage 13. Holding spring 49 is used for fixing the second rod touching section 54 and cap 48. One end of the cap 48 is hooked by the second rod touching section 54, the central portion of the cap 48 touches vibration transmission rod 47, and the other end of the cap 48 is pulled by the holding spring 49. Contact pressure between the cap 48 and the vibration transmission rod 47 is about double the force of the holding spring 49 to be used. The holding spring 49 is a torsion coil spring that is the same as one used in the first actuator 59. Both ends of the holding spring 49 are hooked on two hooks of the cap 48, and the central portion of the straight portion thereof is hooked on a spring hook of the second rod touching section 54, so that the holding spring 49 fixes both of the cap 48 and the second rod touching section 54.

The second stage 12 has, on a part thereof, direction basis portion 42 that is made of metal. The direction basis portion 42 is in contact with base member 11 and first stage 13, through rigid spheres 43 which are respectively located on both two sides of the direction basis portion. Pressure spring 55 that is hooked between the first stage 13 and the base member 11 restrains rotations of two stages 12 and 13 on a vibration transmission rod being coupled through friction with each of the stages 12 and 13.

As shown in FIGS. 3 to 5, first board 17 is provided on a back surface of radiator plate 16. Image pickup element 15 is arranged on the first board 17 (movable portion), with terminal portions of the image pickup element 15 passing through the through holes formed on the radiator plate 16. For detecting a position of the image pickup element 15, on the back side of the first board 17, there are mounted holder 70 housing therein two infrared LEDs 82X and 82Y, an image pickup element driver, and a part of image signal output circuits of the image pickup element such as a preamplifier for processing photoelectric signals coming from the image pickup element and a color separation circuit, a white balance adjusting circuit and an analog processing circuit.

The two infrared LEDs 82X and 82Y are held on the holder 70 so that the direction of movement to be detected (rod) may be perpendicular to the direction of a light source. On the holder, there are provided slits 71X and 71Y to be away from LEDs 82 respectively, and rays of light emitted respectively from LEDs 82 pass through slits 71X and 71Y to be converted into line light sources.

Bendable flexible printed board 67 that connects image pickup element 15 and LEDs 82X and 82Y to second board 18 is connected to the first board 17.

The flexible printed board 67 is connected to second board 18 in a way that the flexible printed board 67 is bent toward the front side in the optical axis direction once immediately after it leaves the first board 17 in the horizontal direction, and the flexible printed board 67 is further turns back to be bent again at the position of the second board 18 in the horizontal direction to have a slack (see FIG. 4).

PSD holder 14 is fixed to base member 11 to surround the first stage 13 connected to the base member, the second stage 12 and image pickup element 15 (including radiator plate 16 and the first board 17), and it houses elements (first and second PSD 62X and PSD 62Y) which detect an amount of movement of the second stage. A light-receiving surface of each of PSD 62X and 62Y is perpendicular to a light flux of each of LED 82X and 82Y on the second stage 13 through a slit extending horizontally on XY plane provided on arrangement sections 61X and 61Y of the light-receiving surface.

The second board 18 is positioned on the back surface of an image forming surface, and is fixed on the PSD holder 14 so that an opening on the back surface of the PSD holder 14 may be covered, and it is wire-connected by the first board 17 and flexible printed board 67.

On the second board 18, there are mounted a circuit that processes signal coming from image pickup element 15 or from first board 17 and a circuit that controls two linear actuators based on position signals of the second stage from PSD and on gyro signals. Two gyro signals whose detection directions are perpendicular to each other are inputted the second board from gyro board (not shown). Further, linear actuator control signals and processed image pickup element signal are outputted from the second board.

In the mean time, with respect to the optical system arranged on the lens barrel 3 side, it is provided with a known single-focus optical system or a zoom optical system, and a constituting lens group and an actuator for moving the lens group in the optical axis direction for zooming and focusing are provided, though details are omitted.

Next, operations of an image pickup apparatus according to the embodiment of the invention will be explained as follows.

Figure 6:
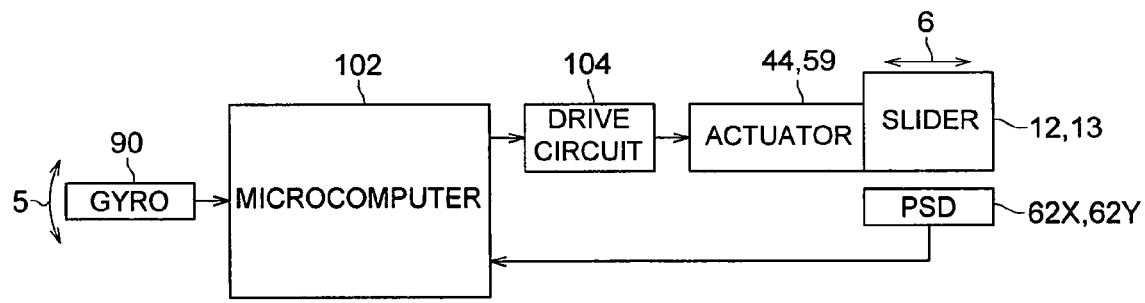
FIG. 6 is a block diagram showing an electrical structure of a drive control circuit for camera shake correction according to the present embodiment.

FIG. 6 is a block diagram showing an electrical structure of a drive control circuit for camera shake correction according to the present embodiment.

The control circuit controls totally gyro element 90 that detects deviation 5 of optical axis L entering lens barrel 3, and outputs angular velocity signals and PSD 62X and 62Y that detect a position of the second stage 12 (including image pickup element 15), and it is provided with microcomputer 102 that calculates an amount of movement and an existing position based on inputted signals and drive circuit 104 that generates driving pulses with prescribed frequency based on drive signals coming from the microcomputer. The driving pulses generated from the drive circuit 104 are outputted to the first and second actuators 30 and 46 to move to the first and second stages 12 and 13 along actuators.

The gyro element 90 is fixed on lens barrel 3, and it detects the angular velocity in each of two axial directions (X-axis direction and Y-axis direction) and outputs it to microcomputer 102.

When angular velocity signals are inputted in microcomputer 102 from the gyro element 90, the microcomputer 102 calculates, from focal length signals of the optical system, an amount of movement and a moving speed of the image on the image pickup element (on the image forming surface) caused by the deviation. Based on the calculated moving speed and the position of the second stage 12 (image pickup element 15), supply voltage with prescribed frequency to be impressed on each of two linear actuators is determined. Namely, the microcomputer 102 calculates a position where the image pickup element 15 should exist originally, based on a position where the second stage 12 (image pickup element 15) calculated based on signals inputted from PSD 62X and 62Y is existing presently and on angular velocity signals inputted from gyro element 90, then, compares a difference from the present position, and conducts feedback control to move the stage so that the image pickup element 15 may return to the position where it should exist originally.

The drive circuit 104 receives signals from microcomputer 102, and outputs drive pulses with frequency that is about 70% of resonance frequency of actuators 30 and 46. The drive pulses are impressed on piezoelectric elements 57 and 55, and move the first and second stages along vibration transmission rods 28 and 47 under the following principle.

Each of FIGS. 7(a), 7(b1), 7(b2) and 7(b3) is a diagram showing a principle of driving actuators.

When drive pulses with a serrated wave having a gentle rise 110 and steep fall portion 112 as shown in FIG. 7(a) are impressed on piezoelectric elements 57 and 55, each of the piezoelectric elements 57 and 55 extends slowly for displacement in the direction of its thickness on the gentle rise portion 110 of the drive pulse as shown in FIG. 7(b2), and each of vibration transmission rods 28 and 47 fixed on piezoelectric elements shows slow displacement in the axial direction. In this case, stage 12 and stage 13 combined frictionally respectively with vibration transmission rods 28 and 47 are moved together with the vibration transmission rods 28 and 47 by friction force.

On the other hand, in the steep fall portion 112 of drive pulses, piezoelectric elements 57 and 55 shrink rapidly to be displaced in the direction of its thickness, and vibration transmission rods 28 and 47 combined respectively with the piezoelectric elements 57 and 55 also are displaced rapidly in the axial direction. In this case, stages 12 and 13 combined frictionally respectively with vibration transmission rods 28 and 47 stay at their positions substantially and do not move, with their inertial forces overcoming the frictional binding forces. As a result, the stages move to the position that is on the right side of what is shown in the initial state shown in FIG. 7(b1). By impressing drive pulses having a serrated wave of this kind on the piezoelectric elements 57 and 55, it is possible to move stages 12 and 13 continuously in the axial direction.

Meanwhile, when the stages 12 and 13 need to be moved leftward, this can be attained by actions opposite to the foregoing when impressing drive pulses composed of rapid rise and gentle fall by changing a serrated waveform to be impressed on the piezoelectric elements 57 and 55. Incidentally, a rectangular wave and other waveforms can also be applied for the drive pulses.

When drive pulses are impressed on piezoelectric element 57 of the first actuator held by the base member, the piezoelectric element 57 repeats expansion and contraction. The expansion and contraction of the piezoelectric element 57 are transmitted to weight 30 and vibration transmission rod 28. Due to a difference of inertial mass between the weight 30 and the vibration transmission rod 28, the weight 30 hardly moves, and the expansion and contraction are transmitted only to the vibration transmission rod 28.

When the first stage 13 moves in the direction of X-axis, the second stage 12 connected to the first stage also moves simultaneously in the direction of X-axis. Owing to pressure spring 55 hooked between the first stage 13 and base member 11 and to rigid spheres 43 located between the second stage 12 and the base member 11, the second stage 12 moves smoothly in the direction of an optical axis with less resistance. In this case, a folded or bent angle of slack portion 67t where the flexible printed board turns back is changed, and thereby, flexible printed board 67 connecting the first board 17 and the second board 18 absorbs a movement of the first stage 13.

On the other hand, when drive pulses are impressed on piezoelectric element 58 of the second actuator 44 held by the second stage 12, the piezoelectric element 58 repeats expansion and contraction as in the foregoing. The expansion and contraction of the piezoelectric element 58 are transmitted to weight 46 and vibration transmission rod 47. Due to a difference of inertial mass between the weight 46 and the vibration transmission rod 47, the weight 46 hardly moves, and the expansion and contraction are transmitted only to the vibration transmission rod 47. Though the vibration transmission rod 47 is glued on rod supporting arm 45 of the second stage 12, the expansion and contraction are not disturbed because adhesives transform elastically. As in the foregoing, a speed difference of the rod between movements from side to side causes the second stage 12 to move in the extended direction of the vibration transmission rod 47 (Y-axis direction), independently of the first stage 13.

When drive pulses are impressed on the second actuator 44 as stated above, the second stage 12 only moves (self-propels) in the direction of Y-axis independently from the first stage 13. Owing to pressure spring 55 hooked between the first stage 13 and base member 11 and to rigid spheres 43 located between the second stage 12 and the first stage, the second stage 12 moves smoothly in the direction of an optical axis with less resistance. In this case, slack portion 67t folded at folding section F is twisted, and flexible printed board 67 connecting the first board 17 and the second board 18 absorbs a movement of the second stage.

In the meantime, though the explanation has been given by using an example wherein slack portion 67t folded to be a U-shape is formed in the illustration, the folding section F may also be one that is given a folding line and is in a V-shape.

Next, a detailed explanation will be given for bendable flexible printed board 67 having an end portion on one side connected to the first board 17, and an end portion on the other side connected to the second board 18 with slack (corresponding to slack portion 67t in the present example) providing movability to the image pickup element 15 and the first board 17. Namely, the image pickup element 15 and the first board 17 correspond to moving body (movable section), and the second board 18 corresponds to a fixed body.

Each of FIGS. 8(a) to 8(c) is a development elevation showing an example of a flexible printed board 67 shown in FIG. 4.

FIG. 8(a) shows an example including closed-slits formed along slack at a slack portion. On the flexible printed board 67 shown in FIG. 8(a), connecting portions 67s for connection with the first board 17 and that for connection with the second board 18 are formed on both ends, and plural circuit patterns (wirings) 67c are formed to connect between connecting portions 67s on opposite sides. Further, plural closed-slits 100 are formed between each circuit pattern (wiring) 67c starting from folding section F (illustrated with broken lines) to both sides of the folding section F. In this case, the end portion on the other side is connected with the second board 18 with slack (corresponding to slack portion 67t in the present example) providing movability to both image pickup element 15 and the first board 17 have a movable, whereby, it means that the plural slits 100 are formed along the slack.

FIG. 8(b) shows another example including open-slits formed along slack at a slack section. On the flexible printed board 67 shown in FIG. 8(b), plural open-slits 100 are formed from folding portion F (illustrated with broken lines) to both sides of the folding portion F along slack.

FIG. 8(c) shows another example including open-slits are formed along a slack at a slack portion. On the flexible printed board 67 shown in FIG. 8(c), plural open-slits 100 are formed from folding portion F (illustrated with broken lines) to both sides of the folding portion F along slack, and a width of the portion where the open-slits 100 are formed is broader than that of the flexible printed board 67 shown in FIG. 8(b). By doing this, it is possible to realize flexible printed board 67 which has less waste and has an excellent area efficiency for the area needed for an unillustrated circuit pattern.

In the specification, "slit" may be formed so that two edge portions facing each other formed by cutting a part of flexible printed board 67 do not touch each other, namely, the two edge portions form a gap between them, as shown in FIGS. 8(b) and 8(c). "Slit" may also be formed so that the two edge portions touch each other as shown in FIG. 8(a).

The slit may extend to form a straight line, S-shaped curve, and V-shaped line.

In the specification, "along slack" means the direction from any one point on one of connecting portion 67s to any one point on the opposite connecting portion 67s, and may be parallel or provide angle to the line extends between center points of respective connecting portions 67s on the flexible printed board.

Further, both of closed-slits shown in FIG. 8(a) or open-slits shown in FIGS. 8(b) and 8(c) is formed on the slack portion, reduces load resistance caused by movement of the first board in the direction for the flexible printed board 67 to be twisted, however, open-slit is preferable to form a slit. The reason for the foregoing is as follows; when strips produced by forming closed-slits are twisted, load is generated by contact between respective strips, while, in the case of open-slits, no contact between respective strips is generated because of air gaps.

FIG. 9 is a perspective view for the first board 17, the second board 18 and the flexible printed board 67.

As shown in FIG. 9, when the first board 17 housing therein image pickup element 15 moves in the direction of arrow H, a bending angle of slack portion 67t of the flexible printed board 67 changes to absorb changes in positional relationship caused by the movement of the first board 17. Further, when the first board 17 moves in the direction of arrow K, each of strips separated by closed-slits or open-slits is twisted to absorb changes in positional relationship caused by the movement of the second board 18.

FIGS. 10(a) to 10(c) are diagrams showing another example of the flexible printed board 67. FIGS. 10(a) to 10(c) are diagrams showing examples of various types of a folding and bending angles of the slack portion where the printed board is bent.

FIG. 10(a) shows an example that the flexible printed board turns back on slack portion 67t with a bent angle of about 180° under the condition that an angle of 0° represents the state of a plane, and closed-slits or open-slits 100 are formed on the slack portion 67t.

FIG. 10(b) shows an example that the flexible printed board turns on slack portion 67t with a bent angle of about 90°, and closed-slits or open-slits 100 are formed on the slack portion 67t. FIG. 10(c) shows an example that the flexible printed board turns on slack portion 67t with a bent angle that is less than 90°, and closed-slits or open-slits 100 are formed on the slack portion 67t.

When any one of the examples shown in FIGS. 10(a) to 10(c) is applied appropriately corresponding to the total working stroke of the first board 17 especially in the direction of arrow K and to the positional relationship between the first board 17 and the second board representing a fixed body, it is possible to reduce load resistance that is produced by the flexible printed board 67 when the first board 17 moves in the direction of arrow K.

The bending or folding angle that is about 90° or more as in FIGS. 10(a) and 10(b) is more preferable, and it can reduce efficiently the load resistance that is caused when the first board 17 moves in the direction (direction of illustration K) of twisting for the flexible printed board 67. For reducing the load resistance efficiently while loading in a camera under the excellent volumetric efficiency, it is preferable that the flexible printed board is arranged to turn back with an angle of about 180° as shown in FIG. 10(a).

Incidentally, flexible printed board 67 may turn back plural times to make the slack portion in W-shaped form.

Each of FIGS. 16, 17(a) to 17(d) is a diagram showing another examples of the flexible printed board 67. FIG. 16 is a perspective view of flexible printed board 67 having the slack portion formed in W-shape. FIG. 17(a) is an expansion plan of the flexible printed board 67 shown in FIG. 16, and each of FIGS. 17(b)-17(d) is a side view showing bent shape of the flexible printed board 67. As shown in FIG. 17(a), by folding positions A, C, E in mountain fold shape and folding position C and E in valley fold shape which is folded in opposite direction to the mountain fold, flexile printed board having a slack portion folded in W-shape is formed as shown in FIGS. 16 and 17(b). Herein, numeral L in FIG. 17 represents a length of folded portion of flexible printed board 67.

By forming the flexible printed board formed in W-shape, the positional relationship between flexible printed board 67 and the second board as a fixed body changes as shown in FIGS. 17(c) and 17(d) when the first board 17 moves in a direction of arrow H1 and arrow H2, respectively.

It shows that the flexible printed board 67 having a slack portion formed in W-shape reduces load resistance when the first board 17 moves in the direction of arrow H, and further reduce the length L of the folded portion.

FIGS. 11(a) and 11(b) are diagrams showing another examples of image pickup apparatus 10 to which the bendable printed board according to the present embodiment is applied. FIG. 11(a) shows a longitudinal sectional view and FIG. 11(b) is a schematic outline drawing that is viewed from the front side. In the diagrams, an image pickup optical system has therein a reflective surface, and a bendable printed board according to the present embodiment is applied to the image pickup optical system whose optical axis is bent.

As shown in FIG. 11(a), a light flux coming from a photographic subject passes through lens 101, and after that, optical axis OA of the light flux is bent by about 90° on reflective mirror 103 on which a reflective surface is formed. Then, the light flux from the subject passes through optical block 104 including plural lens groups wherein a prescribed lens group is movable in the direction of optical axis OB extending in the rear side of its bent position and through low pass filter 65, to form an image on an imaging surface of imaging sensor 15. On the back of the image pickup element 15, there is arranged drive unit 105 for correcting the camera shake explained earlier. Owing to this, the image pickup element 15 and the first board 17 connected electrically with the image pickup element 15 are solidly movable on the surface perpendicular to the optical axis extending in the rear side of its bent position.

FIGS. 18(a) and 18(b) are diagrams showing another examples of image pickup apparatus 10 to which the bendable printed board according to the present embodiment is applied. FIG. 18(a) shows an expansion plan of flexible printed board 67 including slits 100 extending in V shape. FIG. 18(b) shows a longitudinal sectional view of a part of image pickup apparatus 10 applying the printed board thereto and a side view of the folded flexible printed board 67.

Flexible printed board 67 is folded in valley fold shape along position A and position C and folded in mountain fold shape along position B and arranged in image pickup apparatus 10 as shown in the longitudinal sectional view in FIG. 17(b). FIG. 18(b) shows length L of the folded portion of flexible printed board 67.

As shown in FIG. 18(a), slits 100 are formed on slack portion 67t extending to form V-shape. Herein, each slit 100 is formed between plural printed wirings along the slack.

Since slit 100 extends in V-shape, slit 100 is formed with angle θ between the perpendicular direction to the folded positions A, B and C. Therefore, it shortens line L of the folded portion.

Bendable printed board 67 according to the present embodiment is provided with end portion on one side of the printed board 67 connected to the first board 17, turns back at a folding angle of about 180° with slack portion 67t, and is provided with slits 100 formed on the slack portion 67t. An end portion on the other side is drawn out of the image pickup apparatus 10 to be connected to an image processing circuit housed in an unillustrated camera main body.

EXAMPLE

There will be explained, as follows, an example of the flexible printed board relating to the invention on which slit are formed on a slack portion along the slack.

Each of FIGS. 12(*a*) to 12(*c*) is a diagram showing a form of the flexible printed board which was used as a test sample. FIG. 12(*a*) is a side view showing a folded form of the flexible printed board, FIG. 12(*b*) is an expansion plan of the flexible printed board on which two open-slits are formed, and FIG. 12(*c*) is a expansion view of the flexible printed board on which three open-slits are formed.

Six types of flexible printed boards each being folded to be in a form of a side view-shown in FIG. 12(*a*) and having an outer shape of a rectangle and the total width of 10 mm, were used as samples.

The sample on which two slits are formed is one on which two open-slits each having a width of 1.4 mm are formed as shown in FIG. 12(*b*), and pattern sections each being in a form of a 2.4 mm strip are formed on both sides of the open-slits. The sample on which three open-slits are formed is one on which three open-slits each having a width of 0.93 mm are formed as shown in FIG. 12(*c*), and pattern sections each being in a form of a 1.8 mm strip are formed on both sides of the open-slits.

With respect to the other samples, a sample on which one slit is formed is one on which a slit with a width of 2.8 mm is formed on the center of the total width of 10 mm, a sample on which four slits are formed is one with the total width of 10 mm on which four slits each having a width of 0.7 mm are formed, and pattern sections each being in a form of a 1.44 mm strip are formed on both sides of the slits, and a sample on which five slits are formed is one with the total width of 10 mm on which five slits each having a width of 0.56 mm are formed, and pattern sections each being in a form of a 1.2 mm strip are formed on both sides of the slits.

As a comparative example, there was used a flexible printed board with a total width of 10 mm that is folded to be in a form of a side view shown in FIG. 12(*a*) and has no slit formed thereon.

FIG. 13 is a perspective view showing an outer shape of a flexible printed board folded to be in a form of a side view shown in FIG. 12(*a*). FIG. 13 shows a perspective view of a sample on which three slits are formed.

FIG. 14 is a diagram showing measurement conditions. In the measurement conditions, two flat parts 67*f* after valley fold are made to be in the state where the two flat parts are deviated each other by 1 mm relatively on the same plane, and restoring force of these two flat parts 67*f* to return to their original state was measured.

Under the aforesaid measurement conditions, each restoring force was measured for flexible printed boards each having slits in quantity of its own number including the comparative example having no slit formed thereon, as one having slit in quantity of zero.

FIG. 15 shows a graph including measurement results of restoring forces obtained under the aforesaid measurement conditions.

FIG. 15 shows that, when the total including the total width and the sum total of widths of slits is the same to the sum total of widths of pattern sections, forming slits reduce restoring force, and increasing the number of slits reduces the restoring force for twisting of the flexible printed board greatly.

This restoring force is provided resulting in the load resistance when the first board 17 shown in FIG. 9 moves in the direction of arrow K, and closed-slits or open-slits formed on a slack portion along slack reduce the load resistance.

For reducing the load resistance, it is equally preferable that a thickness of the slack portion is within a range of 0.02 mm to 0.2 mm. In this case, it is also possible to make only the portion where slits are formed in the slack portion to be thin partially to form to be in the aforesaid thickness, by a method such as an etching method.

For reducing the load resistance further, it is preferable that circuit pattern (wiring) 67*c* is formed only one side of flexible printed board 67, in at least a portion where slits on the slack portion are formed.

As explained above, by forming closed-slits or open-slits on the slack portion of the printed board in the direction of slack, in the image device which has an image pickup element and a bendable printed board whose end portion on one side is connected to a movable portion having the aforesaid image pickup element for inputting and outputting of information with the image pickup element, and an end portion on the other side is connected to a fixed portion in the state having slack, and moves the image pickup element in the optional direction in a plane perpendicular to an optical axis of the imaging optical system, it is possible to reduce load resistance that is caused by the printed board when the image pickup element moves. Owing to this, an actuator having a driving power that is smaller than that of a conventional actuator can be used, which can realize downsizing and power saving for the image pickup apparatus equipped with a camera shake correcting function.

Though the fixed body corresponds to the second board 18 of the image device in the present embodiment, it is also possible to make other members constituted integrally with the image pickup apparatus to be fixed bodies. Further, though the end portion on the other side is connected to the image pickup element through the first board 17, the end portion on one side may also be connected directly to the image pickup element. For example, one of the end portions may be directly connected to the image pickup element. In that case, the image pickup element corresponds to the movable portion.

Further, when an actuator that is the same as a conventional one is used, it is possible to reduce an amount of slack of the bendable printed board which has been secured, and an area of the bendable printed board can be small. Owing to this, a space needed for housing therein the bendable printed board can be small, which can realize downsizing and low cost of image pickup apparatus equipped with a camera shake correcting function.

Meanwhile, an explanation been given by the use of an example wherein the bendable printed board according to the invention is applied to the image pickup apparatus conducting a camera shake correction by moving the image pickup element on the predefined plane. However, it the scope of the invention is not limited to the example, and the bendable printed board according to the invention may naturally be applied to any embodiment whose end portion on one side is connected to a moving body movable in an arbitral direction on a prescribed plane, and an end portion on the other side is connected to a fixed body with slack providing movability to the moving body.

What is claimed is:

1. An image pickup apparatus comprising:
   an image pickup optical system for guiding a subject light flux;

a movable section comprising an image pickup element for photoelectrically converting the light flux guided by the image pickup optical system; and a bendable printed board comprising:
- a first end connected to the movable section for inputting signal from or outputting signal to the image pickup element;
- a second end connected to a fixed body with slack; and
- a slit formed on at least a part of a slack portion of the printed board and extending along the slack, wherein the movable section is movable in an arbitral direction within a plane perpendicular to an optical axis of the image pickup optical system.

2. The image pickup apparatus of claim 1, wherein the slit is an open-slit.

3. The image pickup apparatus of claim 1, wherein the slack portion is bent at an angle of 90 degrees or more.

4. The image pickup apparatus of claim 1, wherein the printed board is arranged to turn back on the slack portion.

5. A camera comprising the image pickup apparatus of claim 1.

6. An image pickup apparatus comprising:
- an image pickup optical system for guiding a subject light flux;
- a movable section comprising an image pickup element for photoelectrically converting the light flux guided by the image pickup optical system; and
- a bendable printed board comprising:
  - a first end connected to the movable section for inputting signal from or outputting signal to the image pickup element;
  - a second end connected to a fixed body with slack; and
  - a plurality of wirings connected between the first end and the second end; and
  - at least one slit arranged at least a part of a slack portion between the plurality of wirings, wherein the movable section is movable in an arbitral direction within a plane perpendicular to an optical axis of the image pickup optical system.

7. The image pickup apparatus of claim 6, wherein the slit is an open-slit.

8. The image pickup of claim 6, where the slack portion is bent at an angle of 90 degrees or more.

9. The image picking apparatus of claim 6, wherein the printed board is arranged to turn back on the slack portion.

10. A camera comprising the image pickup apparatus of claim 6.

* * * * *